United States Patent [19]

Mihara et al.

[11] Patent Number: 5,184,204
[45] Date of Patent: Feb. 2, 1993

[54] SEMICONDUCTOR DEVICE WITH HIGH SURGE ENDURANCE

[75] Inventors: Teruyoshi Mihara, Yokosuka; Tsutomu Matsushita; Kenji Yao, both of Yokohama; Masakatsu Hoshi; Yutaka Enokido, both of Yokosuka; Yukitsugu Hirota, Kamakura, all of Japan

[73] Assignee: Nissan Motor Co., Ltd., Yokohama, Japan

[21] Appl. No.: 645,872

[22] Filed: Jan. 24, 1991

[30] Foreign Application Priority Data

Jan. 25, 1990 [JP] Japan ................... 2-13613

[51] Int. Cl.$^5$ ................ H01L 29/06; H01L 29/34
[52] U.S. Cl. .................... 357/629; 257/494; 257/341
[58] Field of Search ............. 357/52, 20, 88

[56] References Cited

U.S. PATENT DOCUMENTS

| 3,538,398 | 11/1970 | Whiting | 357/52 |
| 4,012,762 | 3/1977 | Abe et al. | 357/52 |
| 4,774,560 | 9/1988 | Coe | 357/52 |
| 4,801,995 | 1/1989 | Iwanishi | 357/52 |
| 4,803,532 | 2/1989 | Mihara . | |
| 5,032,878 | 7/1991 | Davies et al. | 357/52 |

FOREIGN PATENT DOCUMENTS

| 0061551 | 10/1982 | European Pat. Off. . | |
| 0124139 | 11/1984 | European Pat. Off. . | |
| 0222326 | 5/1987 | European Pat. Off. . | |
| 58-192369 | 11/1983 | Japan | 357/52 |
| 64-69051 | 3/1989 | Japan . | |
| 1-270346 | 10/1989 | Japan | 357/52 |
| 1-295460 | 11/1989 | Japan | 357/52 |
| 1251732 | 10/1971 | United Kingdom . | |
| 1362852 | 8/1974 | United Kingdom . | |
| 2033657A | 5/1980 | United Kingdom . | |

OTHER PUBLICATIONS

Cohen et al., "A High-Performance Planar Power MOSFET", *IEEE Trans. on Electron Devices*, vol. ED-27, No. 2, Feb. 1980, pp. 340-343.

Primary Examiner—J. Carroll
Attorney, Agent, or Firm—Foley & Lardner

[57] ABSTRACT

A semiconductor device in which the breakdown voltages of the cell unit and the guard ring can easily be matched, and the surge endurance of the device can be improved. This semiconductor device includes a guard ring region surrounding the cell diffusion layers which is formed from an array of a plurality of guard ring cells, where each of the guard ring cells is identical to each of the cell diffusion layers and the guard ring cells are electrically connected mutually, so that the diffusion depths of each of the cells of the guard ring region and the cell diffusion layers are identical, and consequently the breakdown voltages for the guard ring region and the cell diffusion layers can be made equal to each other.

7 Claims, 9 Drawing Sheets

F I G. 7
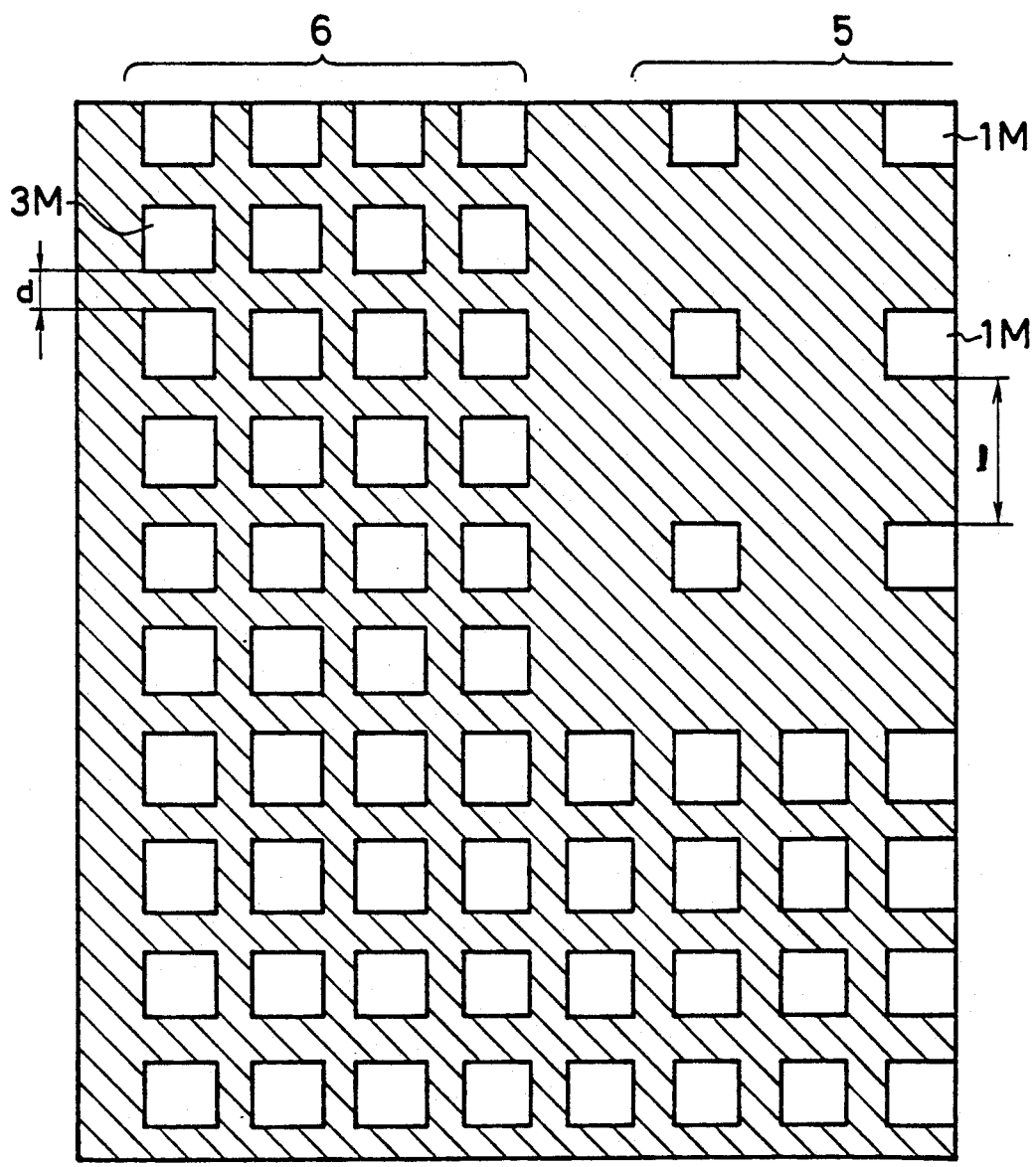

SEMICONDUCTOR DEVICE WITH HIGH SURGE ENDURANCE

BACKGROUND OF THE INVENTION

1. Field of the Invention

The present invention relates to a semiconductor device such as a power device which has a guard ring structure.

2. Description of the Background Art

As a conventional method for improving the surge endurance, there are several propositions such as those disclosed in Japanese Patent Application Laid Open No. 60-196975 (1985) and Japanese Patent Application Laid Open No. 61-182264.

An example from the latter reference is shown in FIG. 1, where a device comprises an N+ substrate 101, an epitaxial layer 102, a guard ring 103, a channel region 104, a source region 105, a gate oxide 106, a gate electrode 107, field oxide 108, a source electrode 109, and a drain electrode 110.

In this conventional example, in order to prevent the avalanche failure due to the surge occurring at a time of switching the induction load by using a power MOS, there is provided a diffusion profile in which a bottom of the channel region 104 of a MOSFET cell is reaching an N+ substrate 101 such that the breakdown voltage of this portion is lowered, so as to provide a function of a Zener diode.

Also, in this conventional example, the surge endurance is improved as an effective Zener area is increased by applying the same structure to a guard ring 103 surrounding the channel region 104.

Next, another conventional example for improving the surge endurance is shown in FIG. 2, where those elements equivalent to the corresponding ones in the prior example are given the same reference numerals, and where there is also provided a well region 111 for forming a Zener. In this conventional example, the guard ring 113 is formed in the same diffusion profile as the well region 111, and the channel region 104 and the well region 111 are separately provided so as to be able to reduce the variations in manufacturing by optimally controlling each region separately.

Now, in recent years, there has been a very noticeable trend in the field of power MOS to compactify the FET cell by using the ultra fine manufacturing technique. This is due to the feature of the power MOS that by manufacturing a finer cell, the packing density can be increased and the on-resistance can be reduced.

However, in a conventional semiconductor device such as those shown in FIGS. 1 and 2, the finer cell has often resulted in creating a situation in which the breakdown voltage of the cell unit exceeds that of the guard ring, in which case the surge current mainly flows through the guard ring, such that the surge endurance of the chip as a whole is lowered.

According to the research done by the present inventors in order to understand the aforementioned problem, this problem is caused by the fact that the lower concentration of the diffusion profile occurring in the case where the diffusion window size S of the Zener cell is smaller than twice the diffusion depth $X_j$ of the Zener cell, compared with the other cases.

Namely, as shown in FIG. 3, when the diffusion takes place simultaneously from a window W1 of an opening sufficiently larger than its diffusion depth $X_{j1}$ and from a window W2 of an opening smaller than a twice of its diffusion depth $X_{j2}$, the window W2 receives more influence from the two dimensional spread effect compared with the window W1, so that the impurity concentration at the central portion X2—X2 of the window W2 becomes lower than that at the central portion X1-X1 of the window W1, and the diffusion depth becomes shallower for the window W2.

For instance, the diffusion profile for the device of FIG. 1 described above, with a cell opening S=3 μm, a guard ring width W=30 μm, and the diffusion depth=approximately 4 μm, is shown in FIG. 4.

As shown in FIG. 4, the impurity concentration for the cell unit indicated by a curve B-Bp, which was measured along B—B section of the channel region 104 in FIG. 1, is lower than one third of that of the guard ring indicated by a curve A-Ap, which was measured along A-A section of the guard ring 103 in FIG. 1. In this case, the breakdown voltage for the cell unit is equal to 37 V while that of the guard ring is equal to 35 V, and the evidence of all the current to concentrate to the guard ring alone had been found in the surge application test.

The impurity concentrations for the cell unit and the guard ring measured along B-B section and A-A section, respectively, in FIG. 2 also have the similar forms as shown in FIG. 4. Therefore, the similar result can also be observed for the device of FIG. 2 described above, in which this situation occurs when the diffusion window of well region 111 is smaller than a twice of its diffusion depth.

SUMMARY OF THE INVENTION

It is therefore an object of the present invention to provide a semiconductor device having such a guard ring structure in which the breakdown voltages of the cell unit and the guard ring can easily be matched, so that the surge endurance of the device can be improved.

This object is achieved in the present invention by providing a semiconductor device, comprising: a semiconductor substrate of a first conduction type; a group of cell diffusion layers of a second conduction type which is formed inside the semiconductor substrate and is connected to electrodes; and a guard ring region of the second conduction type which is surrounding the cell diffusion layers and is connected to said electrodes, the guard ring region being formed from an array of a plurality of guard ring cells, where each of the guard ring cells is identical to each of the cell diffusion layers and the guard ring cells are electrically connected mutually.

Other features and advantages of the present invention will become apparent from the following description taken in conjunction with the accompanying drawings.

BRIEF DESCRIPTION OF THE DRAWINGS

FIG. 7 is a plan view of an example of a mask pattern to be used in manufacturing the semiconductor device of the first and second embodiments shown in FIGS. 5 and 6.

DETAILED DESCRIPTION OF THE PREFERRED EMBODIMENTS

According to the present invention, there is provided a guard ring region comprising a plurality of cells arranged in array, each of which is identical to each of the cell diffusion layers, and which are electrically connected mutually.

This mutual electrical connection among the cells of the guard ring region can be realized either by arranging the cells such that parts of each neighboring cells are overlapping, or by providing connection diffusion regions between each of the plurality of the cells which are arranged with a prescribed interval between each neighboring cells.

With this configuration, the sizes of the diffusion windows are identical in the diffusion process, so that the diffusion depths of each of the cells of the guard ring region and the cell diffusion layers are identical, and consequently the breakdown voltages for the guard ring region and the cell diffusion layers can be made equal to each other.

Figure 1:
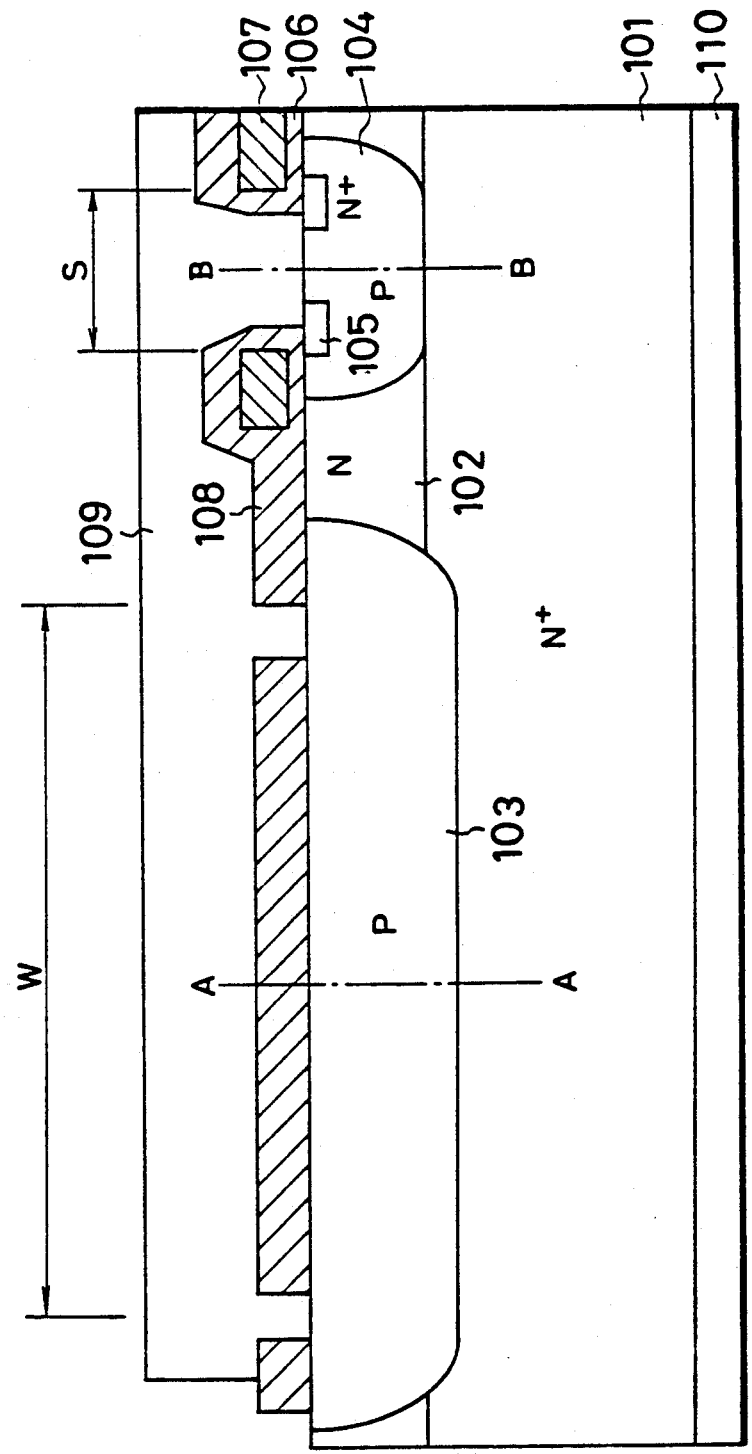
FIG. 1 is a cross sectional view of an example of a conventional semiconductor device with improved surge endurance.
Figure 2:
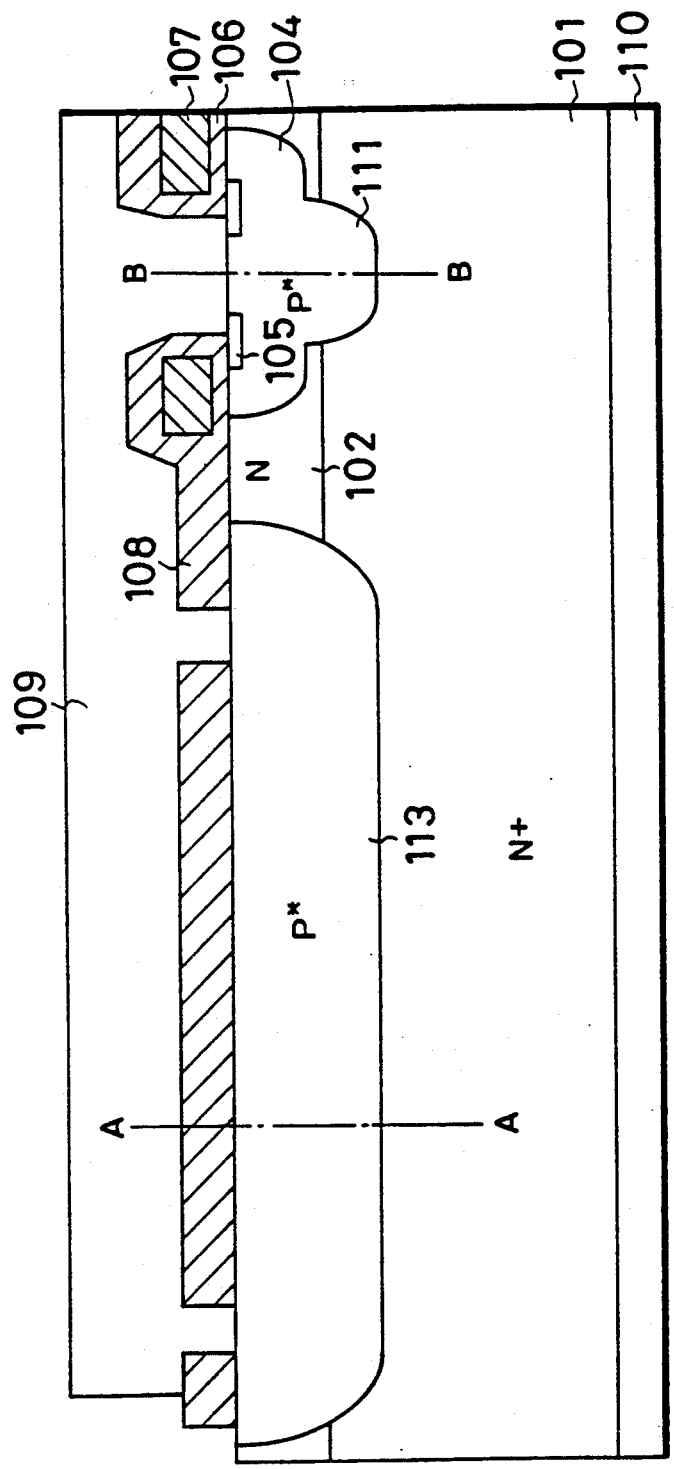
FIG. 2 is a cross sectional view of another example of a conventional semiconductor device with improved surge endurance.
Figure 3:
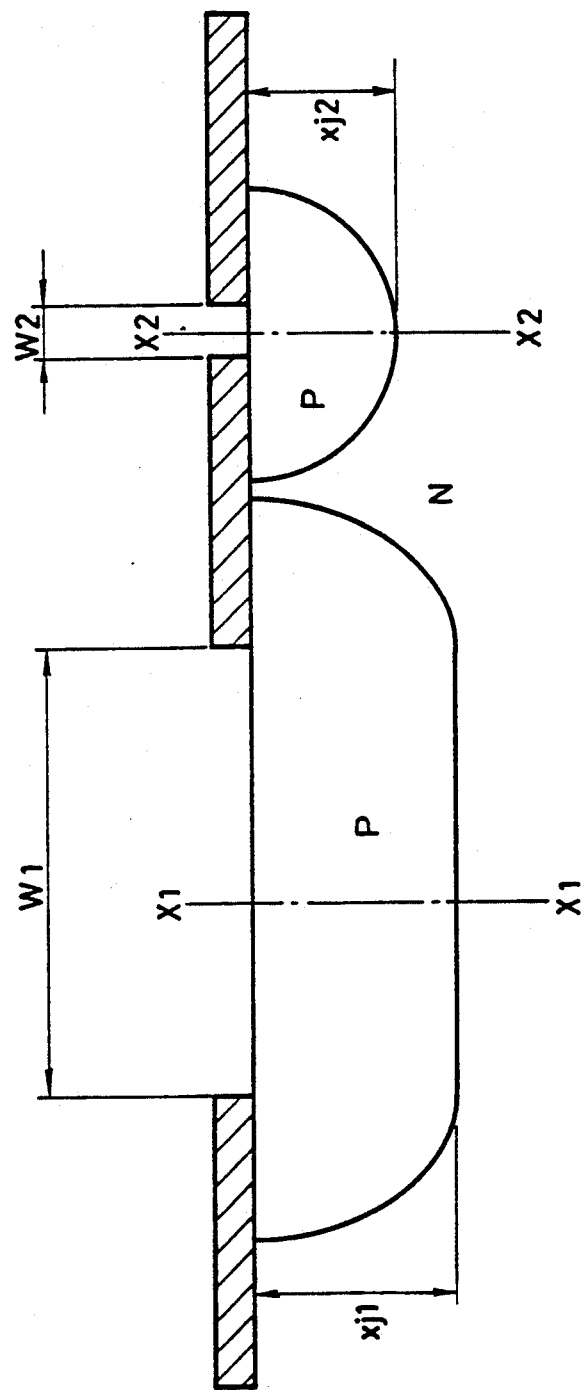
FIG. 3 is a cross sectional view of an exemplary configuration for a conventional semiconductor device in which the problem of smaller impurity concentration for the cell unit than the guard ring occurs.
Figure 4:
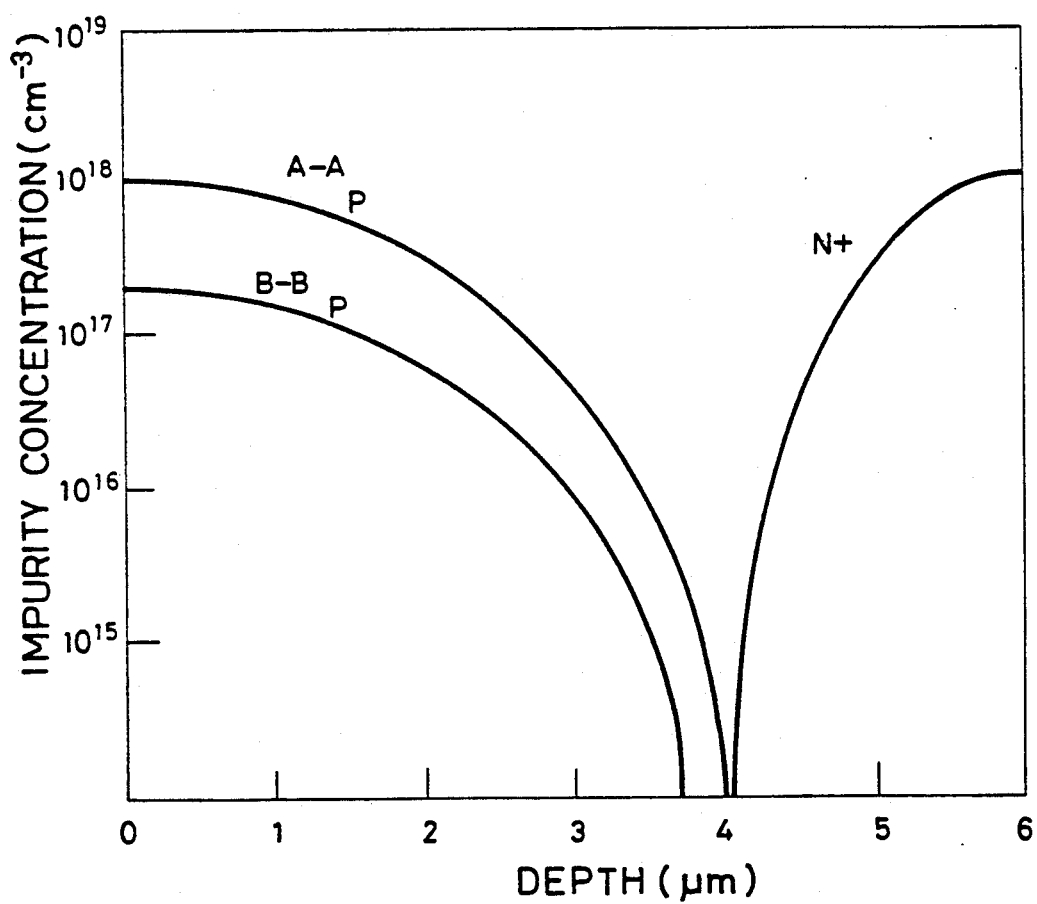
FIG. 4 is a graph of an impurity concentration versus a depth for the Example of FIG. 1 with a configuration equivalent to that shown in FIG. 3.

Now, several embodiments of a semiconductor device according to the present invention will be described with references to the drawings. In the following description, those elements equivalent to the corresponding ones in the conventional examples of FIGS. 1 and 2 are given the same reference numerals, and their description is generally omitted.

Figure 5:
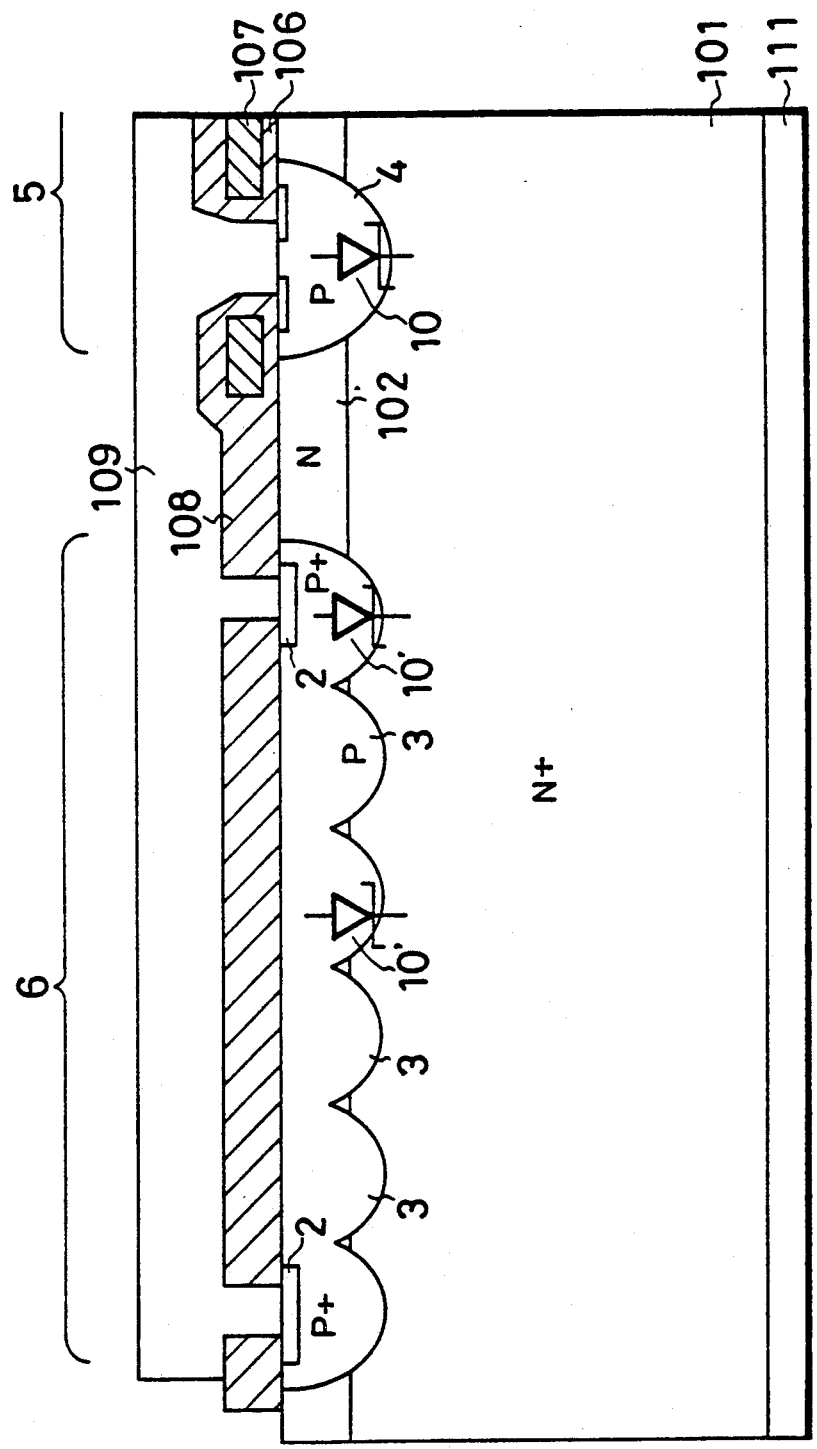
FIG. 5 is a cross sectional view of a first embodiment of a semiconductor device according to the present invention.

Referring now to FIG. 5, a first embodiment of a semiconductor device according to the present invention will be described.

In this first embodiment, the device includes a plurality of p-type guard ring cells 3 and a power MOS cell channel region 4, all of which are formed by the same diffusion process with separate diffusion windows of the identical shape. As a result, the diffusion profile for each of the guard ring cells 3 and the channel region 4 is substantially identical. These guard ring cells 3 and the channel region 4 are contacting with the N+ substrate 101 inside the bulk, so as to form Zener diodes 10 and 10'. It is noted that although the Zener diodes 10' are shown for only a selected number of guard ring cells 3 for the sake of simplifying the drawing, in reality each one of the guard ring cells 3 forms a Zener diode 10'. An FET region is formed around the power MOS cell channel region 4, while a guard ring region 6 is formed by an array of the guard ring cells 3, where the guard ring cells 3 are arranged such that parts of each neighboring cells are overlapping, so as to have the mutual electrical connections among the guard ring cells 3, while the outer most members of the guard ring cells 3 are connected to the source electrode 109. The outer most members of the guard ring cells 3 also have usual high concentration contact regions 2 contacting with the source electrode 109, in order to reduce the contact resistance.

Figure 6:
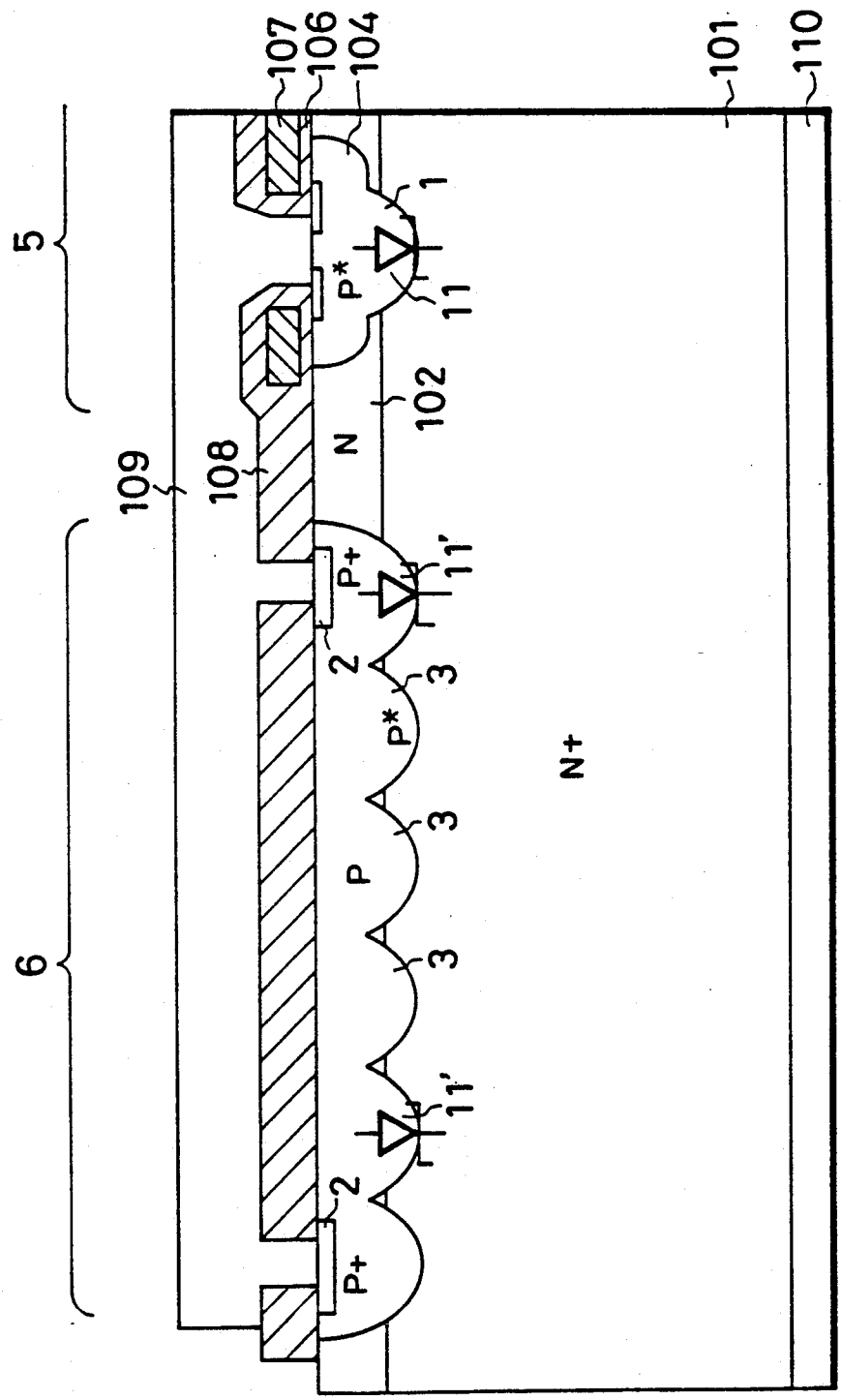
FIG. 6 is a cross sectional view of a second embodiment of a semiconductor device according to the present invention.

Referring now to FIG. 6, a second embodiment of a semiconductor device according to the present invention will be described.

This second embodiment differs from the first embodiment in that the power MOS cell channel region 4 of the first embodiment shown in FIG. 5 is replaced by a well region 1 below the channel region 104. The guard ring cells 3 and the well region 1 are contacting with the N+ substrate 101 inside the bulk, so as to form Zener diodes 11 and 11'. It is noted that although the Zener diodes 11' are shown for only a selected number of guard ring cells 3 for the sake of simplifying the drawing, in reality each one of the guard ring cells 3 forms a Zener diode 11'.

An example of a mask pattern to be used in manufacturing the semiconductor device of the first and second embodiments shown in FIGS. 5 and 6 is shown in FIG. 7, which includes first diffusion windows 1M for the channel region 4 of the first embodiment or the well region 1 of the second embodiment, and second diffusion windows 3M for the guard ring cells 3 of the first and second embodiments.

The first diffusion windows 1M are openings for the FET region 5 in which the power MOS cells are to be arranged, and are arranged with a prescribed interval l between each neighboring windows, where the interval l is selected such that the on-resistance of the device becomes minimum.

The second diffusion windows 3M are openings for the guard ring region 6, and are arranged with a prescribed interval d between each neighboring windows, where the interval l is smaller than a twice of the diffusion length and is selected such that such that parts of each neighboring guard ring cells 3 overlaps.

It is to be noted that the guard ring cells 3, the channel region 4, and the well region 1 in the first and second embodiments described above have rectangular shapes, but other geometrical shape such as a hexagonal shape, a circular shape, and others may be used instead.

When the diffusion takes place by using such a mask, the distribution of the impurity has a three-dimensional spread so that it gradually decreases as distance from a center of the diffusion cell increases. For this reason, the breakdown voltage for Zener diode is determined by the concentration profile in the depth direction at the center of the cell. Consequently, it is necessary for the interval d of the second diffusion windows 3M to have a such a value that the tail of diffusion profile does not reach the center of the cell. With such a value for the interval d of the second diffusion windows 3M, the breakdown voltages of the FET region 5 and the guard ring region 6 can be matched exactly, and as a result, the surge endurance can be maintained at high level even for the power MOS manufactured by using the ultra fine manufacturing technique.

Figure 8:
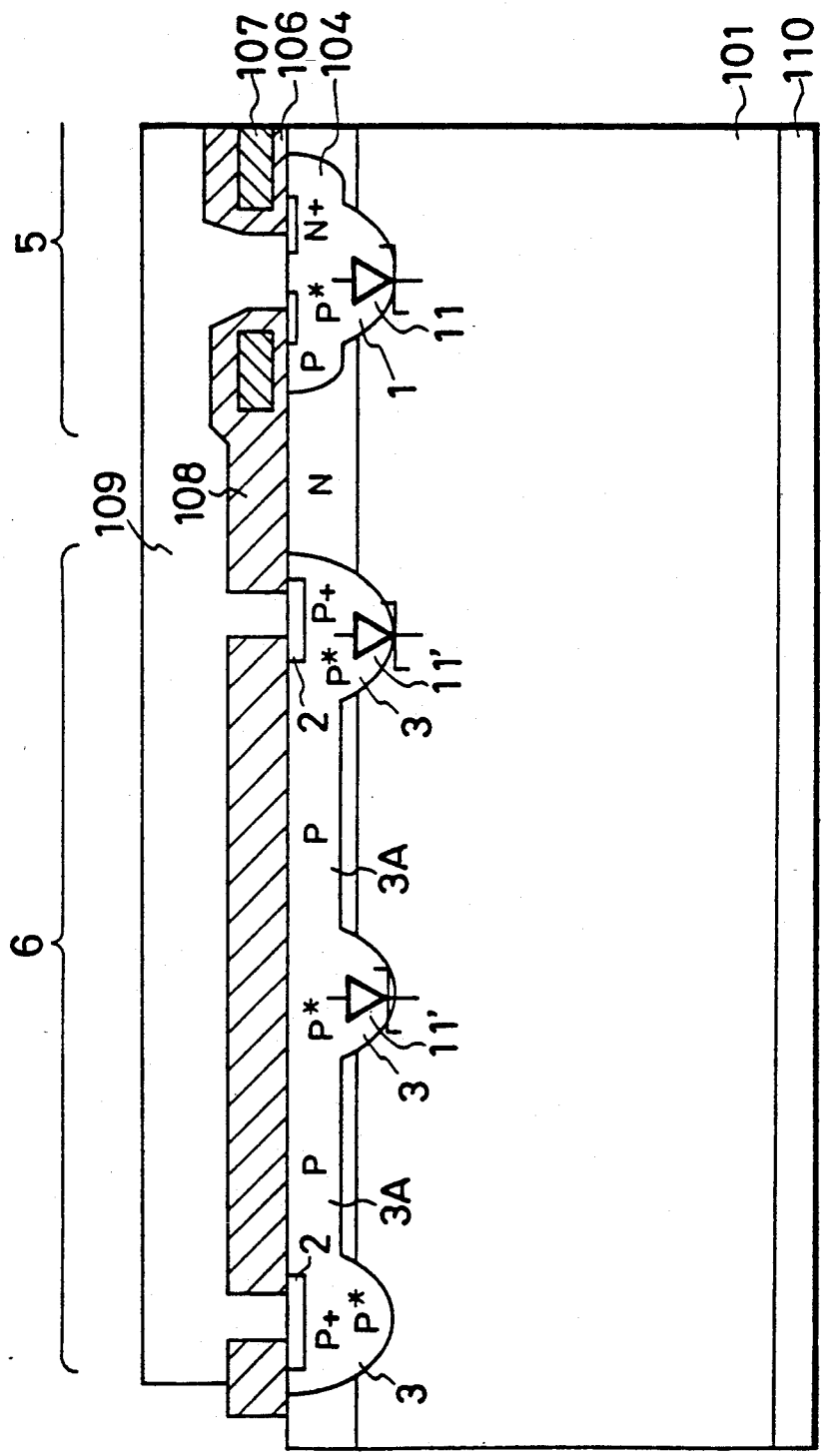
FIG. 8 is a cross sectional view of a third embodiment of a semiconductor device according to the present invention.

Referring now to FIG. 8, a third embodiment of a semiconductor device according to the present invention will be described.

This third embodiment differs from the second embodiment in that each of the guard ring cells 3 is separated from its neighbors by a sufficiently large interval, but is connected with its neighbors through a shallow connection diffusion regions 3A. As in the previous embodiment, the guard ring cells 3 and the well region 1 are contacting with the N+ substrate 101 inside the bulk, so as to form Zener diodes 11 and 11'. It is noted that although the Zener diodes 11' are shown for only a selected number of guard ring cells 3 for the sake of simplifying the drawing, in reality each one of the guard ring cells 3 forms a Zener diode 11'.

Such a configuration can be manufactured, for example, by first diffusing the guard ring cells 3 and then forming the connection diffusion regions 3A by using the other mask, or by first pouring ions for the guard ring cells 3 and then pouring low dosed ions for the connection diffusion regions 3A by using the other mask. These methods have a disadvantage of increasing the manufacturing steps, but also have an advantage that they can cope with the change or variation of the diffusion condition easily because the requirement on the interval d for the guard ring cells 3 is not as severe as in the cases of the first and second embodiments.

Figure 9:
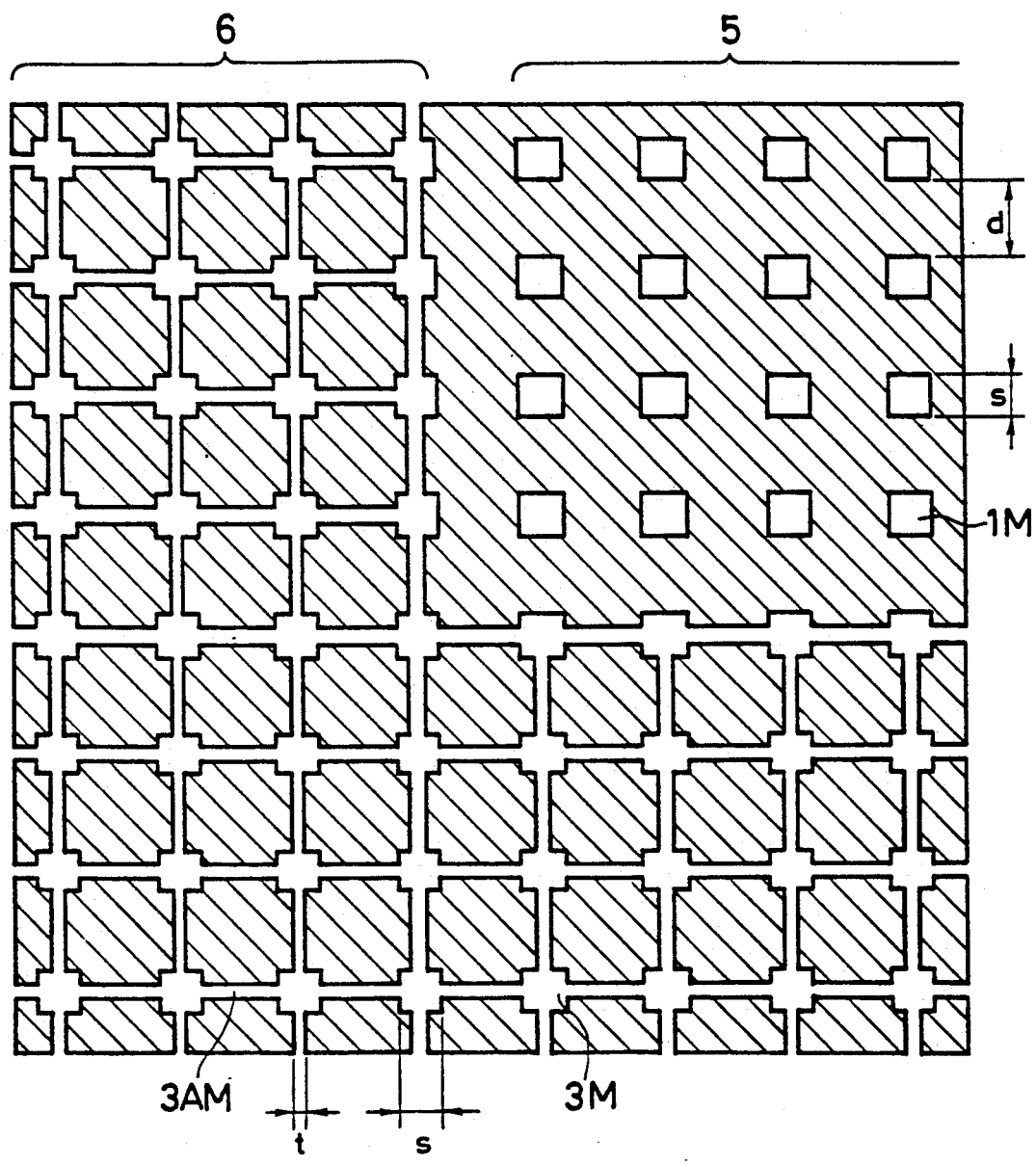
FIG. 9 is a plan view of an example of a mask pattern to be used in manufacturing the semiconductor device of the third embodiment shown in FIG. 8.

This configuration can also be manufactured by using a mask pattern shown in FIG. 9, by which the manufacturing can be done in a single step. Namely, in addition to the first diffusion windows 1M for the well region 1 and the second diffusion windows 3M for the guard ring cells 3, this mask pattern of FIG. 9 also has third diffusion windows 3AM for the connection diffusion regions 3A bridging each neighboring second diffusion windows 3M. Here, it is important that an opening length t for the third diffusion windows 3AM is smaller than an opening length s for the second diffusion windows 3M, such that the impurity concentration can be lowest at the third diffusion windows 3AM and consequently the diffusion can be shallow.

As described, according to the present invention, it is possible to provide a semiconductor device in which the breakdown voltages of the cell unit and the guard ring can easily be matched, and the surge endurance of the device can be improved, by providing a guard ring region comprising a plurality of cells arranged in array, each of which is identical to the cell diffusion layer, and which are electrically connected mutually.

It is to be noted that although the above embodiments have been described for the case of a power MOS, it should be apparent from the foregoing description that the present invention is equally applicable to any semiconductor device having a PN junciton as a cell and the guard ring surrounding the cell.

Besides this, many modifications and variations of the above embodiments may be made without departing from the novel and advantageous features of the present invention. Accordingly, all such modifications and variations are intended to be included within the scope of the appended claims.

What is claimed is:

1. A semiconductor device, comprising:
   a semiconductor substrate of a first conduction type;
   a group of cell diffusion layers of a second conduction type which is formed inside the semiconductor substrate and is connected to electrodes; and
   a guard ring region of the second conduction type which is surrounding the cell diffusion layers and is connected to said electrodes, the guard ring region being formed from an array having an overall ring shape formed by a plurality of interconnected guard ring cells, where each of the guard ring cells is identical in shape to each of the cell diffusion layers and the guard ring cells are electrically connected mutually.

2. The semiconductor device of claim 1, wherein the guard ring cells are electrically connected mutually by being arranged with parts of neighboring ones of the guard ring cells overlapping.

3. The semiconductor device of claim 1, wherein each of the guard ring cells is separated from neighboring ones of the guard ring cells, and the guard ring region includes connection diffusion regions for electrically connecting neighboring ones of the guard ring cells.

4. The semiconductor device of claim 3, wherein the connection diffusion regions are shallower than the guard ring cells.

5. The semiconductor device of claim 1, wherein the cell diffusion layers and the guard ring cells are contacting the semiconductor substrate.

6. The semiconductor device of claim 1, wherein the cell diffusion layers include well region contacting the semiconductor substrate.

7. The semiconductor device of claim 1, wherein each of the guard ring cells has a transverse cross sectional shape identical to that of each of the cell diffusion layers.

* * * * *